(12) United States Patent
Hsu et al.

(10) Patent No.: US 7,350,298 B2
(45) Date of Patent: Apr. 1, 2008

(54) METHOD FOR FABRICATING CIRCUIT BOARD WITH CONDUCTIVE STRUCTURE

(75) Inventors: Shih-Ping Hsu, Hsin-chu (TW);
Sao-Hsia Tang, Hsin-chu (TW);
Ying-Tung Wang, Hsin-chu (TW);
Wen Hung Hu, Hsin-chu (TW); Chao Wen Shih, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 73 days.

(21) Appl. No.: 11/467,629

(22) Filed: Aug. 28, 2006

(65) Prior Publication Data

US 2007/0186412 A1   Aug. 16, 2007

(30) Foreign Application Priority Data

Feb. 9, 2006   (TW) .............................. 95104314 A

(51) Int. Cl.
*H01K 3/10* (2006.01)
*H05K 3/02* (2006.01)
*H05K 3/34* (2006.01)

(52) U.S. Cl. ............................ 29/852; 29/832; 29/840; 29/846

(58) Field of Classification Search ................. 29/825, 29/832, 833, 840, 852
See application file for complete search history.

(56) References Cited

U.S. PATENT DOCUMENTS

2006/0202331 A1 * 9/2006 Hu ............................. 257/737
2006/0204650 A1 * 9/2006 Hu ............................. 427/96.1
2007/0161233 A1 * 7/2007 Seok .......................... 438/638

FOREIGN PATENT DOCUMENTS

TW          508987 A4   11/2002

* cited by examiner

*Primary Examiner*—C. J Arbes
(74) *Attorney, Agent, or Firm*—Foley & Lardner LLP

(57) ABSTRACT

A method for fabricating a circuit board having a conductive structure is disclosed. The method includes: forming first and second insulating protective layers respectively on first and second surfaces of a circuit board; forming a conductive layer on the first insulating protective layer and the openings; forming first and second resist layers on the conductive layer and the second insulating protective layer respectively; forming first electrically connecting structures by electroplating on the exposed conductive layer over a plurality of first and second electrically connecting pads in openings of the first resist layer; removing the first and the second resist layers and the conductive layer covered by the first resist layer; and forming second electrically connecting structures by stencil printing on the conductive layer over the second electrically connecting pads on the first surface and on a plurality of third electrically connecting pads of the second surface of the circuit board.

22 Claims, 13 Drawing Sheets

METHOD FOR FABRICATING CIRCUIT BOARD WITH CONDUCTIVE STRUCTURE

FIELD OF THE INVENTION

The present invention relates to a method for fabricating a circuit board with a conductive structure, and more particularly, to a method for fabricating two different conductive structures on an IC packaging substrate.

BACKGROUND OF THE INVENTION

Modern electronic products tend to be light, slim, and small, and, such products usually exhibit high performance, multi-functionality, and high efficiency. Such design characteristics are often made possible by using flip chip semiconductor package technology, an advanced semiconductor packaging technology. In the current technology, a plurality of electrode pads is deposited on the surface of a semiconductor integrated circuit (IC) chip. Additionally, solder bumps are formed on the electrode pads, and electrically connecting pads corresponding to the solder bumps are formed on an organic electronic package substrate, providing a package wherein the chip is installed on the package substrate facing down on the conductive surface.

Since more and more products are designed with the goal of miniaturization, applications for flip chip technology are continuously expanding, making it a standard chip package technology. Meanwhile, passive components such as electrical resistors, capacitors and inductors are typically needed within devices to improve the electrical performance. Such passive components are adhered to a circuit board using surface mount technology, such that solder bumps and a surface adherent metal element co-exist on the circuit board. These solder materials and components with different heights and sizes are mixed together with a semiconductor chip of a different type to be electrically conducted.

Currently, stencil-printing technology is popularly used to form a solder material on a substrate. Referring to FIG. 1, the current stencil-printing technology mainly provides a substrate 10, a plurality of electrically connecting pads 12 on the substrate 10, and a solder mask 11 printed on the surface of the substrate 10, the solder mask 11 having openings to expose the electrically connecting pads 12. During application of the solder material, a stencil 13 with a plurality of grids 13a is placed on the substrate 10. After coating the stencil 13 with the solder material, a scraper 14 scrapes the stencil 13 or a spraying process is performed, such that the grids 13a of the stencil 13 are filled with the solder material. Additionally, a solder layer (not shown) is formed on the electrically connecting pads after removing the stencil 13. Subsequently, under a reflow-soldering process at a temperature at which solder melts, the solder is reflowed to form a solder element (not shown) on the electrically connecting pads 12 of the substrate 10, such that the solder element provides for external electrical connection. Therefore, solder is formed with different heights and sizes by electroplating on the electrically connecting pads of the substrate during different electroplating processes. Furthermore, an electrically connecting contact is formed with different heights to electrically connect semiconductor chips that are adhered on different surfaces.

However, a portion of the electrically connecting pads is covered by an insulating protective layer covering the electrically connecting pads, which causes the size of the exposed electrically connecting pads to be smaller. In addition, This lack of exposure causes a problem in allocating the subsequent solder material, causing the solder to be poorly adhered on the electrically connecting pads, resulting in low yield of such stencil printing technology. In particular, a circuit board with high circuit density experiences significant difficulty in terms of allocation and adhesion.

To address the problems involving solder material for stencil printing, electroplating technology has been used to form solder material on circuit boards, wherein the requirement of providing thin circuits is still satisfied. Referring to Taiwan Patent No. 508987 entitled "Method for Solder Electroplating," FIGS. 2A to 2F, demonstrate a circuit board 20 with an electrically connecting pads 201 that is covered with an organic insulating protective layer (solder mask) 21. First, referring to FIG. 2A, a plurality of openings 211 is formed in the protective layer 21 by a patterning process to expose the electrically connecting pads 201. Referring to FIG. 2B, a conductive layer 22 is formed on the surface of the protective layer 21 by physical vapor deposition. Then, referring to FIG. 2C, a resist layer 23 is formed over the surface of the conductive layer 22, and openings 231 are formed in the resist layer to expose the electrically connecting pads 201. Subsequently, referring to FIG. 2D, a solder material 24 is formed in the openings 231 by an electroplating process using the conductive layer 22 as a conductive path. Additionally, referring to FIG. 2E, the resist layer 23 and the conductive layer 22 covered by the resist layer are removed. Finally, referring to FIG. 2F, pre-solder bumps 24' are formed by a reflow-soldering process.

Furthermore, a similar solder material is often chosen for forming pre-solder bumps or the solder material on each of the electrically connecting pads of a circuit board by either stencil printing or electroplating, such that the pre-solder bumps and the solder material have the same conductivity. However, a better conductive material is sometimes needed when conductivity is critical or optimal mechanical connections are required. Therefore, it is not always ideal to use similar materials for various features.

Moreover, the bumps for electrically connecting a chip that are formed on the electrically connecting pads of the circuit board and the solder balls that electrically connect to the printed circuit board (PCB) are electrically connected to different electronic devices. Therefore, the materials for the bumps and the solder balls are different, requiring formation of structures with two different materials by electroplating on the circuit board. A resist layer must be formed on the circuit board, and an opening is formed on the resist layer to expose a portion of the electrically connecting pads, such that the bumps can be formed by electroplating on the electrically connecting pads. Then, the resist layer is removed, and another resist layer is formed. Additionally, the bumps are covered by the new resist layer to expose the foregoing unexposed electrically connecting pads. Finally, solder balls are formed by electroplating on the subsequently exposed electrically connecting pads.

The bumps and solder balls having different materials formed on the circuit by electroplating require coverage with resist layers two different times, as well as the electroplating process and resist layer removal. Accordingly, fabrication complexity is increased, reducing productivity.

Additionally, the package thickness is increased by the electroplating used in formation of the bumps and/or the solder balls, and may result in uneven heights during the later electroplating process. However, if the bumps or the solder balls have uneven heights after reflow soldering, the electrical conductivity with the chip or printed circuit board can be reduced.

Therefore, it is desirable to create a design that overcomes the foregoing problems in achieving optimal mechanical and electrical connectivity.

SUMMARY OF THE INVENTION

In light of the above prior-art drawbacks, a primary objective of the present invention is to provide a method for fabricating a circuit board with a conductive structure that provides two different conductive structures, so as to provide two different electrical conductivity options for the electrically connecting pads.

In accordance with the foregoing objective, the present invention proposes a method for fabricating a circuit board with a conductive structure which comprises the steps of:

providing a circuit board with first and second surfaces, the first surface of the circuit board having a plurality of first and second electrically connecting pads, and the second surface having a plurality of third electrically connecting pads, wherein the first and second insulating protective layers are respectively formed on the first and second surfaces, and a plurality of openings are formed to expose the first, second, and third electrically connecting pads;

forming a conductive layer on the surfaces of the first insulating protective layer and the openings, electrically connected to the first and second electrically connecting pads on the first surface of the circuit board;

forming first and second resist layers on the surfaces of the conductive layer and the second insulating protective layer, respectively, and forming a plurality of openings in the first resist layer to expose the conductive layer on the first and second electrically connecting pads on the first surface;

forming first electrically connecting structures by electroplating on the exposed conductive layer over the first and second electrically connecting pads in the openings of the first resist layer;

removing the first and the second resist layers and the conductive layer covered by the first resist layer; and forming second electrically connecting structures by stencil printing on the conductive layer over the second electrically connecting pads on the first surface of the circuit board and on the third electrically connecting pads of the second surface of the circuit board.

In this process, the first and second resist layers and the conductive layer are removed collectively or separately by chemical or physical methods, such that the electroplated first electrically connecting structures are exposed on the first and second electrically connecting pads.

Then, the first electrically connecting structure are formed on the first electrically connecting pads by electroplating using the conductive layer as a current conducting path. After the first and second resist layers and the conductive layer are removed, the second electrically connecting structures are formed by stencil printing the surface of the first electrically connecting structures on the second electrically connecting pads. Therefore, two different electrically connecting structures are formed by electroplating and stencil printing on the electrically connecting pads.

The first and second electrically connecting structures are formed on the first and second electrically connecting pads from different materials. The first electrically connecting structure consists of electrically connecting solder material, and is formed by electroplating; while the second electrically connecting structure consists of pre-solder bumps formed of tin, silver, gold, bismuth, lead, zinc, copper or other compound metals, such bumps being formed by stencil printing. The first electrically connecting structure has low connectivity and is formed on the first, second, and third electrically connecting pads. Alternately, the second electrically connecting structure has high connectivity. Furthermore, the first electrically connecting structure is used for electrical connection of surface mount technology, while the second electrically connecting structure is used for electrical connection of reflow soldering. Accordingly, the requirements for different electrical connection structures are met.

Another method of the invention to fabricate a circuit board with a conductive structure comprises the steps of:

providing a circuit board with first and second surfaces, the first surface on the circuit board having a plurality of first and second electrically connecting pads, and the second surface having a plurality of third electrically connecting pads, wherein first and second insulating protective layers are respectively formed on the first and second surfaces, and a plurality of openings are formed to expose the first, second, and third electrically connecting pads;

forming a first conductive layer on the surfaces of the first insulating protective layer and the openings, electrically connected to the first and second electrically connecting pads on the first surface of the circuit board;

forming a second conductive layer on the surfaces of the second insulating protective layer and the openings, electrically connected to the third electrically connecting pads on the circuit board;

forming first and second resist layers on the surfaces of the first and second conductive layers respectively, and forming a plurality of openings in the first and second resist layers to expose the first and second conductive layers on the first and third electrically connecting pads;

forming first electrically connecting structures by electroplating on the first and second conductive layers on the first and third electrically connecting pads;

removing the first and second resist layers, and removing the first and second conductive layers that were covered by the first and second resist layers; and forming second electrically connecting structures by stencil printing on the surface of the second electrically connecting pad in the openings of the first insulating layer.

The first electrically connecting structure is formed on the first and third electrically connecting pads by electroplating using the first and second conductive layers as a current conducting path. After the resist layer and the first and second conductive layers are removed; the second electrically connecting structures are formed by stencil printing on the second electrically connecting pads. In summary, two different electrically connecting structures are formed by electroplating and stencil printing on the electrically connecting pads.

In addition, the first and second electrically connecting structures are formed on the first, second, and third electrically connecting pads from different materials. Therefore, the requirement for structures having different electrical connection properties is provided.

A further method for fabricating a circuit board with a conductive structure comprises the steps of:

providing a circuit board with first and second surfaces, the first surface on the circuit board having a plurality of first and second electrically connecting pads, and the second surface having a plurality of third electrically connecting pads, wherein first and second insulating protective layers are respectively formed on the first and second surfaces, and a plurality of openings are formed to expose the first, second, and third electrically connecting pads;

forming a first conductive layer on the surfaces of the first insulating protective layer and the openings, and is electrically connected to the first and second electrically connecting pads on the first and second surfaces of the circuit board;

forming a second conductive layer on the surfaces of the second insulating protective layer and the openings, electrically connected to the third electrically connecting pads on the circuit board;

forming first and second resist layers on the surfaces of the first and second conductive layers respectively, and forming a plurality of openings in the first and second resist layers to expose the first and second conductive layers on the first, second, and third electrically connecting pads;

forming first electrically connecting structures by electroplating on the exposed first and second conductive layers over the first, second, and third electrically connecting pads in the openings of the first and second resist layers;

removing the first and second resist layers, and removing the first and second conductive layers covered by the first and second resist layers; and forming second electrically connecting structures by stencil printing on the first electrically connecting structures of the first conductive layer on surfaces of the second electrically connecting pads in the openings of the first insulating layer.

The first electrically connecting structures are formed on the first and third electrically connecting pads by electroplating using the first and second conductive layers as a current-conducting path. After the resist layer is removed, the first and second conductive layers are removed. Then, the second electrically connecting structures are formed by stencil printing on the first electrically connecting structures on the second electrically connecting pads. Accordingly, two different electrically connecting structures are formed respectively by electroplating and stencil printing on the first to third electrically connecting pads. Furthermore, the first and second electrically connecting structures are formed on the first, second, and third electrically connecting pads from different materials. In this way, the requirement for structures with different electrical connection properties is attained.

BRIEF DESCRIPTION OF THE DRAWINGS

The present invention can be more fully understood by reading the following detailed description of the preferred embodiments, with reference made to the accompanying drawings, wherein:

FIGS. 3D' and 3E' are cross-sectional views showing another embodiment of FIGS. 3D and 3E;

FIG. 4E' is a cross-sectional view showing another embodiment of FIG. 4E;

FIG. 5C' is a cross-sectional view showing another embodiment of FIG. 5C;

FIG. 6E' is a cross-sectional view showing another embodiment of FIG. 6E.

DETAILED DESCRIPTION OF THE EMBODIMENTS

The present invention is described in the following with specific embodiments, so that one skilled in the pertinent art can easily understand other advantages and effects of the present invention from the disclosure of the invention. The present invention may also be implemented and applied according to other embodiments, and the details may be modified based on different views and applications without departing from the spirit of the invention.

The First Embodiment

Referring to FIGS. 3A to 3F, cross-sectional views are depicted of a proposal for a method for fabricating a circuit board with an electrically connecting structure. Note that all the drawings are simplified and only the basic construction of the present invention is shown. Therefore, elements appearing in the figures for the present invention are not drawn as to real numbers, shapes, and sizes as used in actual practice. The numbers, shapes and sizes are variable design matters, and the arrangements of the elements can be more complicated.

Figure 1:
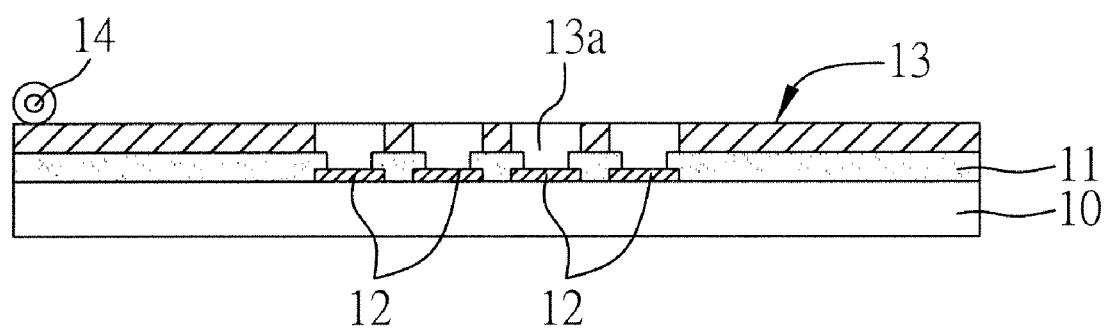
FIG. 1 is a cross-sectional view showing the formation of solder balls on a circuit board by stencil printing known in the prior-art.
Figure 2A:
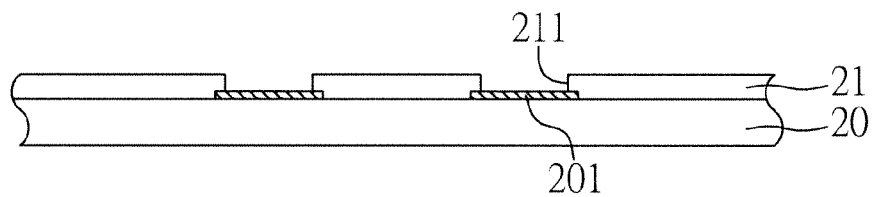
FIGS. 2A to 2F are cross-sectional views demonstrating the formation of solder material on a circuit board by electroplating known in the prior-art.
Figure 2B:
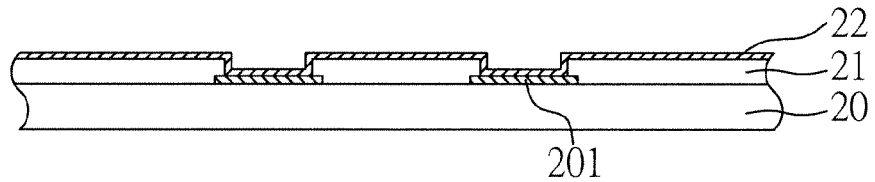
Figure 2C:
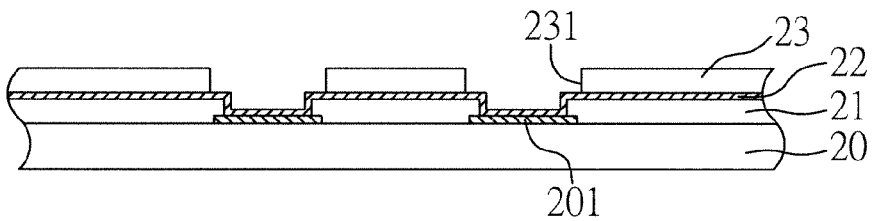
Figure 2D:
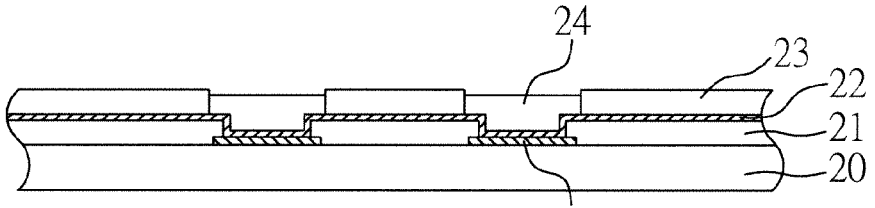
Figure 2E:
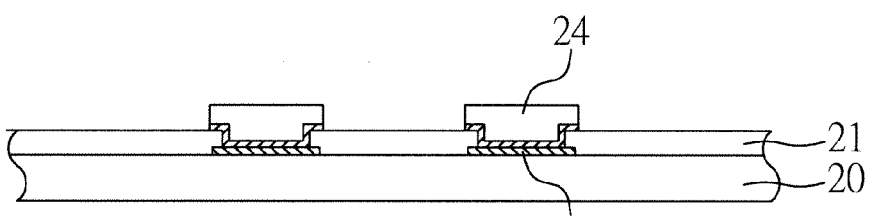
Figure 2F:
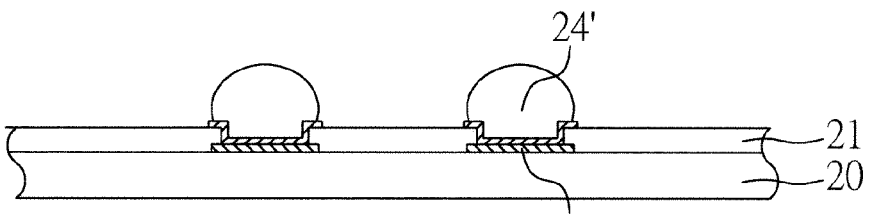
Figure 3A:
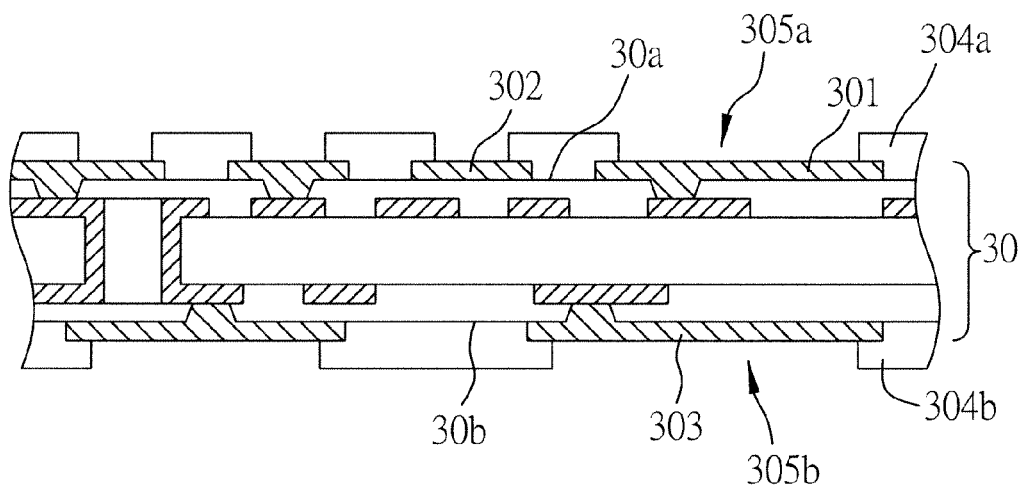
FIGS. 3A to 3F are cross-sectional views showing the first embodiment of a method for fabricating a circuit board with a conductive structure of the present invention.

First of all, referring to FIG. 3A, a circuit board 30 is provided with a first surface 30a and a second surface 30b, and the first surface 30a has a plurality of differently sized first electrically connecting pads 301 and second electrically connecting pads 302, while the second surface 30b has a plurality of third electrically connecting pads 303. Additionally, first and second insulating protective layers 304a, 304b (also referred to herein as first and second solder mask) are formed on the first and second surface 30a, 30b respectively, and a plurality of openings 305a, 305b are formed to expose the first, second, and third electrically connecting pads 301, 302, and 303, wherein the first and second insulating protective layers 304a, 304b are formed by exposure and developing.

Figure 3B:
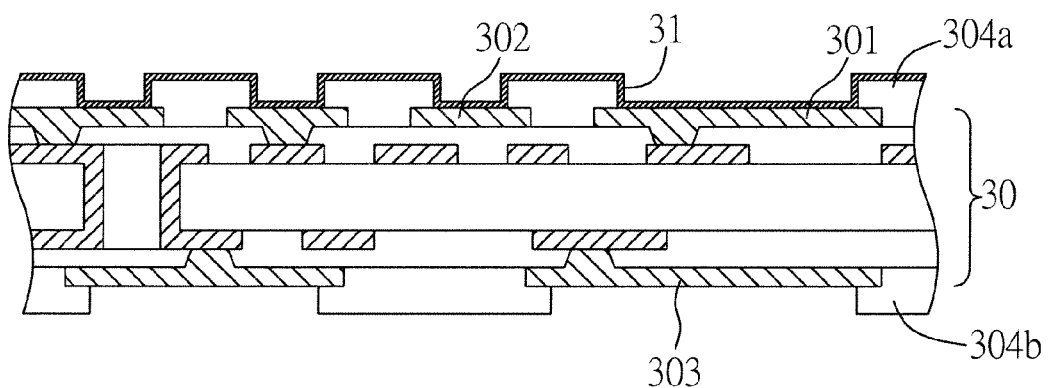

Secondly, referring to FIG. 3B, a conductive layer 31 is formed by physical vapor deposition or chemical deposition (electroless-plating) on the surface of the first insulating protective layer 304a and the surface of the openings 305a of the circuit board 30. As a result, the conductive layer 31 in the openings 305a is electrically connected to the first and second electrically connecting pads 301, 302.

Figure 3C:
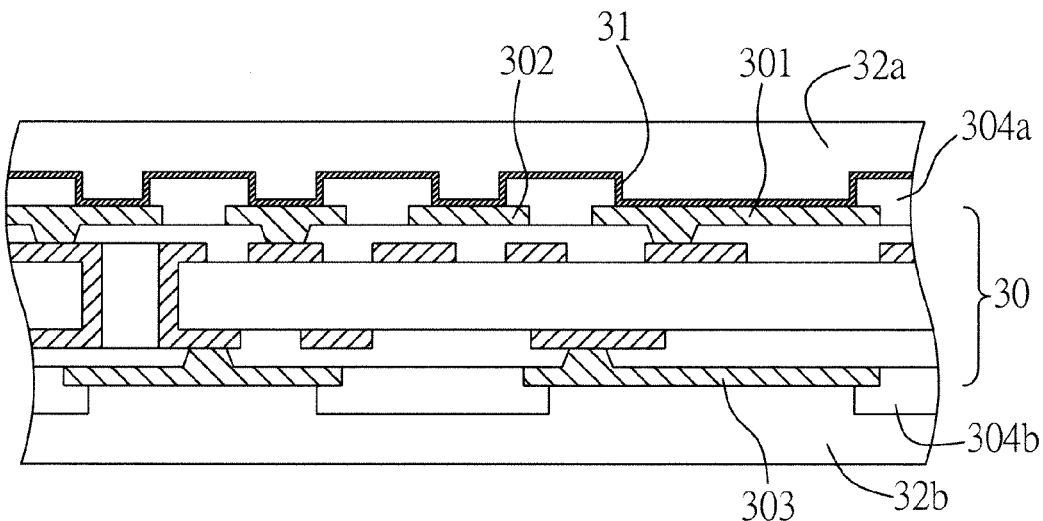

Then, referring to FIG. 3C, first and second resist layers 32a, 32b are formed by laminating and coating on the conductive layer 31, as well as on the second insulating protective layer 304b and the plurality of third electrically connecting pads 303.

Figure 3D:
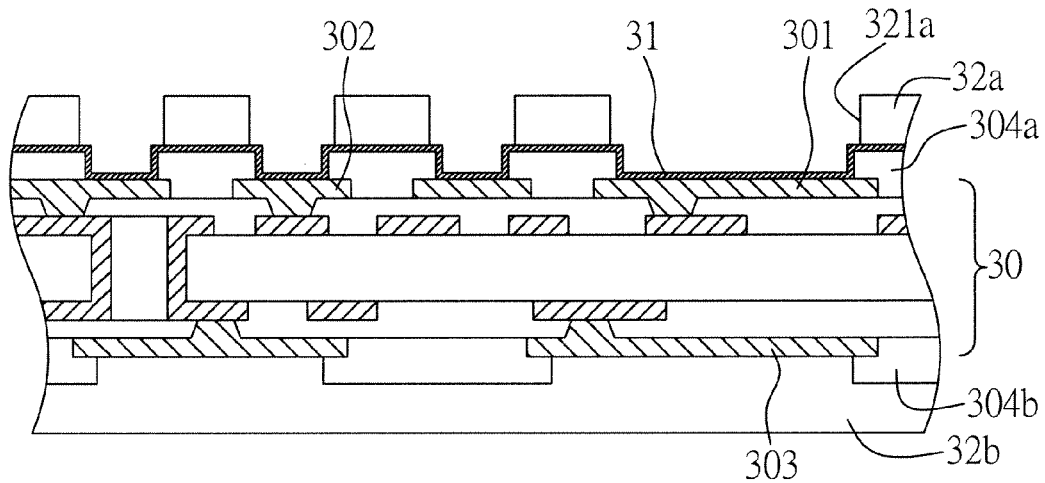
Figure 3D:
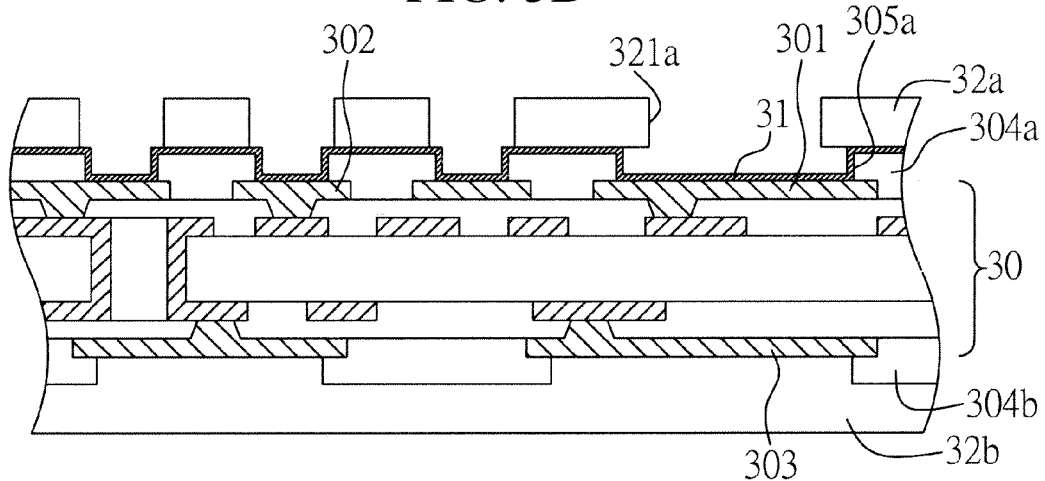

Referring to FIG. 3D, a plurality of openings 321a are formed on the first resist layer 32a by exposure and developing, such openings 321a corresponding to the first and second electrically connecting pads 301, 302. Accordingly, the conductive layer 31 on the surfaces of the first and second electrically connecting pads is exposed.

Figure 3E:
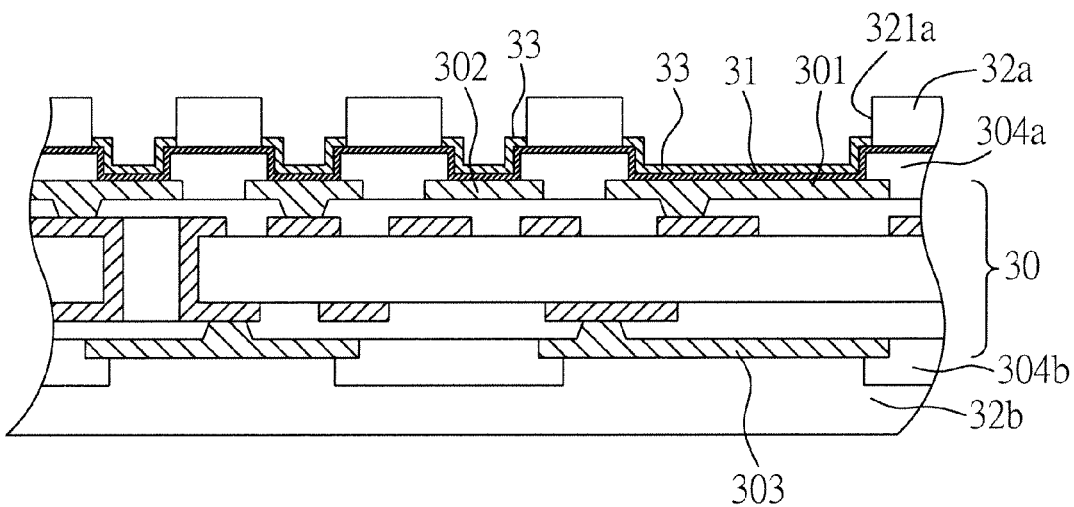
Figure 3E:
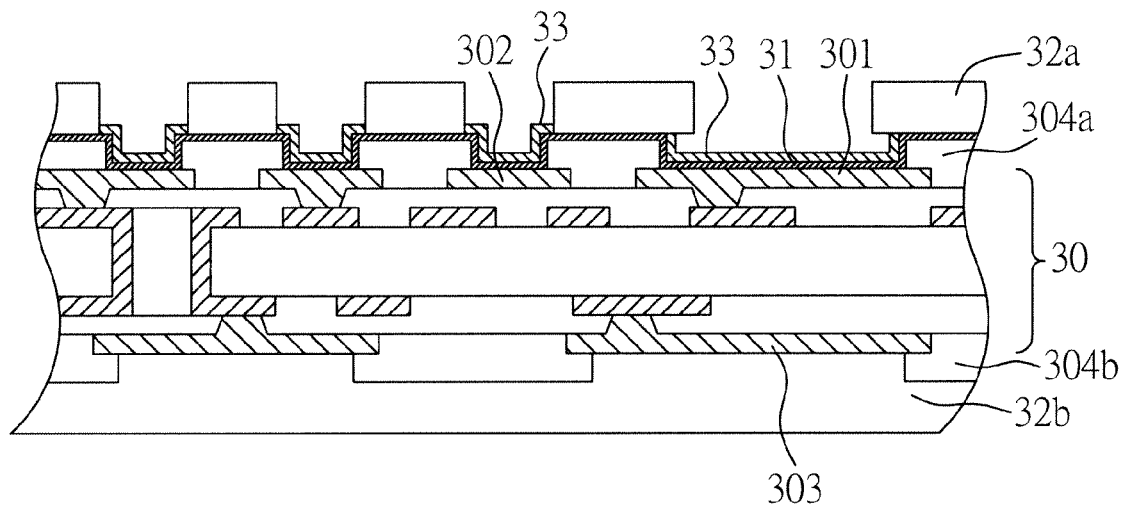

In addition, referring to FIG. 3E (skipping FIG. 3D' for now), a first electrically connecting structures 33 are formed by electroplating on the conductive layer 31 of the first and second electrically connecting pads 301, 302 at the bottom of the openings 321a, using conductive layer 31 as a current-conducting path, wherein the electrically connecting structure 33 formed by electroplating is composed of a conductive solder material.

Figure 3F:
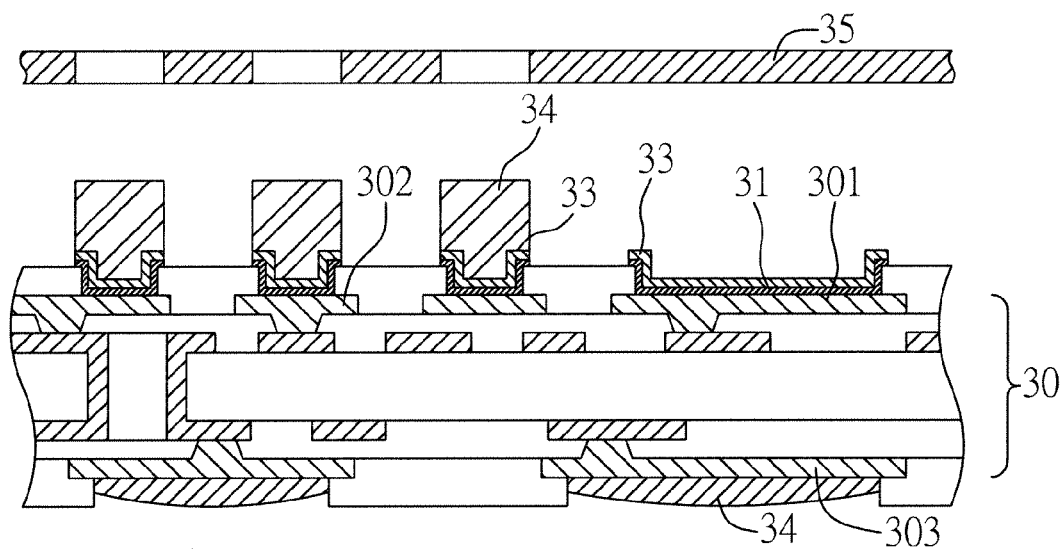

Furthermore, referring to FIG. 3F (skipping FIG. 3E' for now), the first resist layer 32a and the conductive layer 31 covered by the first resist layer 32a are removed by physical or chemical stripping. Either the first resist layer 32a is removed before removing the conductive layer 31 covered by the first resist layer 32a, or the first resist layer 32a and its underlying conductive layer 31 are removed collectively by a physical or chemical removal process. Therefore, the first electrically connecting structures 33 are exposed on the first and second electrically connecting pads 301, 302. Likewise, the second resist layer 32b is removed by the same physical or chemical stripping process to expose the third electrically connecting pads 303.

Finally, as also depicted in FIG. 3F, a second electrically connecting structures 34 are formed by stencil printing on the third electrically connecting pads 303 and the first electrically connecting structures 33 of the second electrically connecting pads 302 (but not pads 301). In addition, the second electrically connecting structure 34 are pre-solder bumps formed by materials of tin, silver, gold, bismuth, lead, zinc, copper or other compound metals.

Referring again to FIGS. 3D and 3E along with FIG. 3A, the openings 321a in the first resist layer corresponding to the first electrically connecting pad 301 are larger than the openings 305a (shown in FIG. 3A) in the first insulating protective layer. Accordingly, the first electrically connecting structures 33 are formed on the conductive layer 31 such that the first electrically connecting structure 33 forms a lip around the edge of each of the openings 305a coated with the conductive layer 31 of the first insulating protective layer.

Referring to FIGS. 3D' and 3E', each of the openings 321a in the first resist layer corresponding to the first electrically pad 301 are smaller than the openings 305a in the first insulating protective layer. Accordingly, the first electrically connecting structures 33 are only formed in the interior of the openings 305a of the first insulating protective layer.

The first electrically connecting structures 33 are formed on the conductive layer 31 on first and second electrically connecting pads 301, 302 by electroplating, while the second electrically connecting structures 34 are formed by stencil printing on the first electrically connecting structures 33 of the second electrically connecting pads 302, as well as the surface of the third electrically connecting pads 303. As a result, electrically connecting structures with different materials are formed on the first, second, and third electrically connecting pads 301, 302, 303, respectively, by two different processes, such as electroplating and stencil printing. Additionally, the first electrically connecting structure 33 is electrically-conductive solder material, and provides for electrical connection of surface mount technology. Moreover, an instance of the first connecting structure is referred to as a ball pad, and the first electrically connecting structures 33 can be formed by electroplating. On the other hand, an instance of the second electrically connecting structure 34 is referred to as a pre-solder bump, and the electrically conductive bump is formed by stencil printing for connecting with a circuit board. In summary, two different processes for different electrical connections form the three electrically connecting structures 301, 302, and 303.

The Second Embodiment

Referring to FIGS. 4A to 4F, another fabricating method is provided for the present invention. The main difference from the foregoing embodiment is that the first and second electrically connecting structures are formed respectively on the surfaces and in the openings of the first and second insulating protective layer. Then, the second electrically connecting structures are formed by the stencil printing on the first conductive layer of the surface of the second electrically connecting pads. The detailed description is as followings.

Figure 4A:
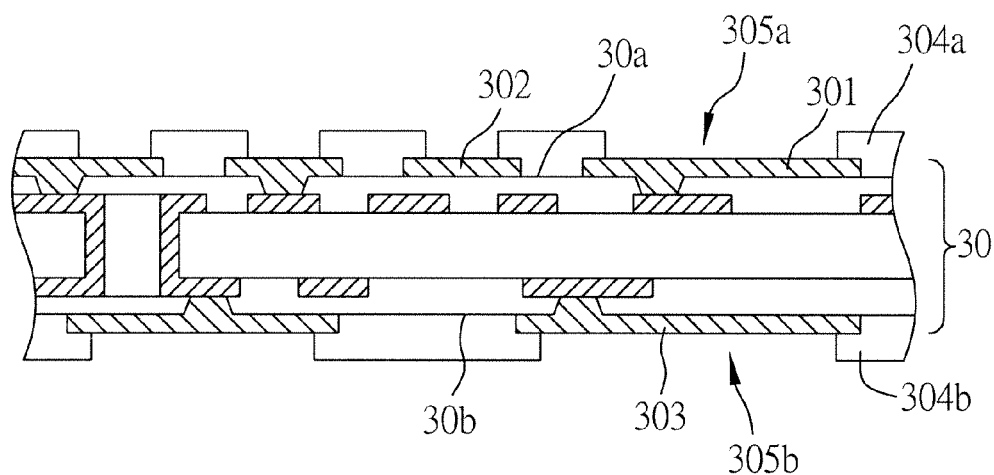
FIGS. 4A to 4F are cross-sectional views showing the second embodiment of a method for fabricating a circuit board with a conductive structure of the present invention.

Firstly, referring to FIG. 4A, a circuit board 30 is provided with a first surface 30a and a second surface 30b, and the first surface 30a has a plurality of first electrically connecting pads 301 and a second electrically connecting pads 302, while the second surface 30b has a plurality of third electrically connecting pads 303. Moreover, first and second insulating protective layers 304a, 304b are formed on the first and second surfaces of the circuit board 30, and a plurality of openings 305a, 305b are formed to expose the first, second, and third electrically connecting pads 301, 302, 303.

Figure 4B:
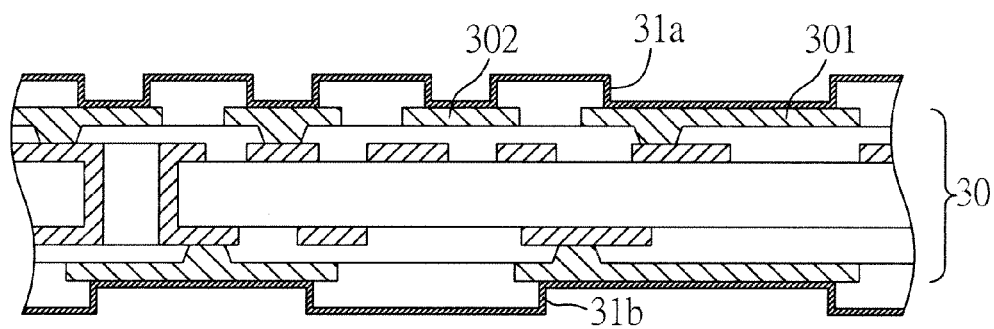

Secondly, referring to FIG. 4B, first and second conductive layers 31a, 31b are formed on the surface of the first and second insulating protective layers 304a, 304b and in the openings 305a, 305b of the first and second insulating protective layers 304a, 304b. Moreover, the first and second conductive layers 31a, 31b are electrically connected to the first, second and third electrically connecting pads 301, 302, 303.

Figure 4C:
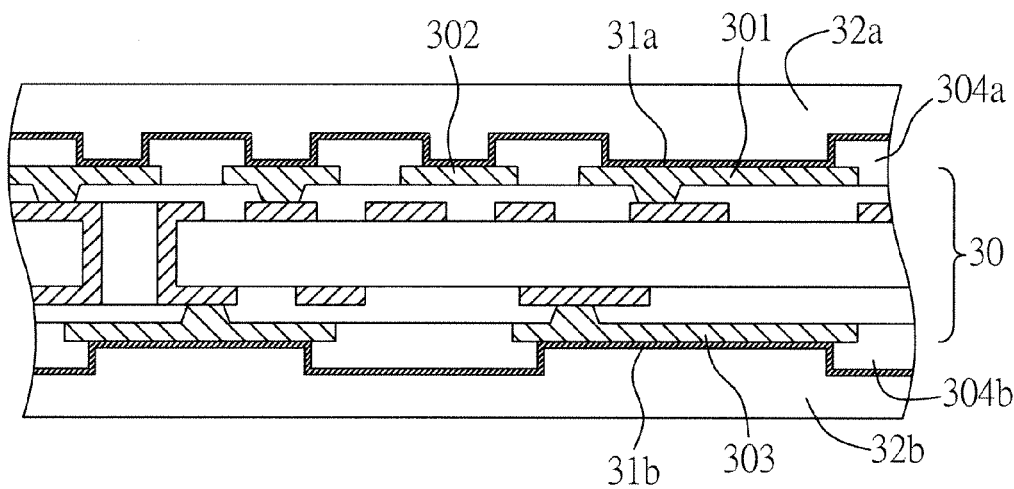
Figure 4D:
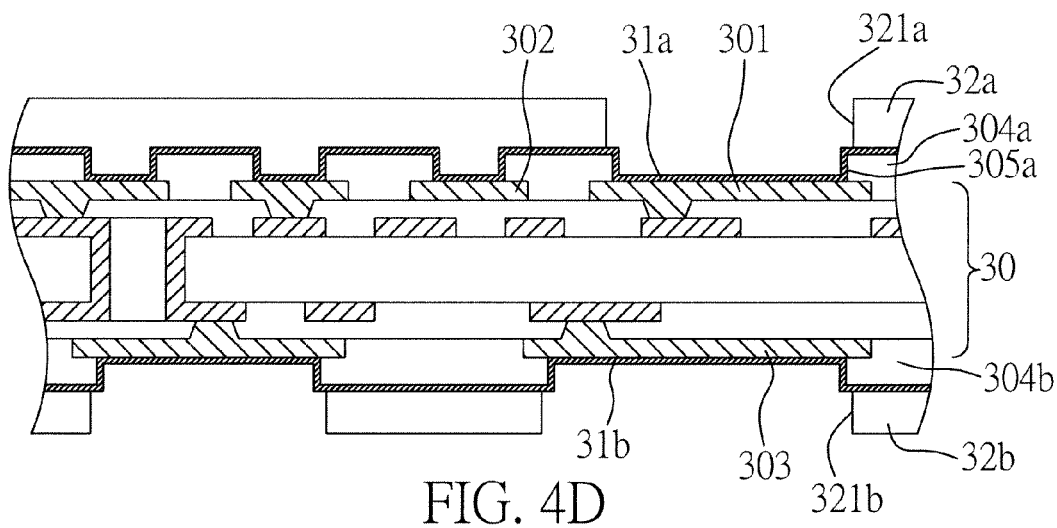

Then, referring to FIGS. 4C and 4D, a first and second resist layers 32a, 32b are formed by printing on the first and second conductive layers 31a, 31b. In addition, a plurality of openings 321a, 321b corresponding to the first and third electrically connecting pads 301, 303 are formed by exposure and developing of the first and second resist layers 32a, 32b. Therefore, the first and second conductive layers 31a, 31b on the surfaces of the first and third electrically connecting pads 301, 303 are exposed.

Figure 4E:
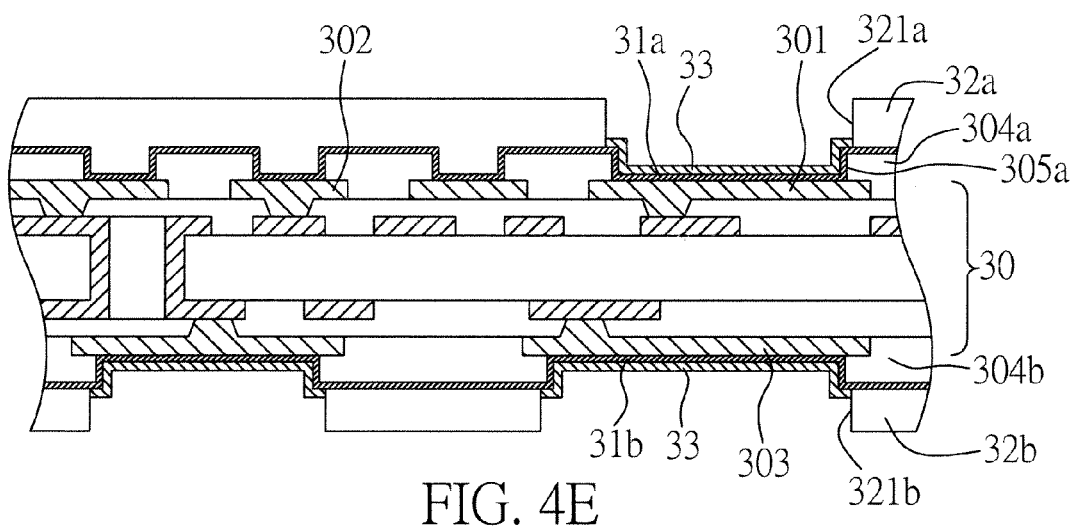
Figure 4E:
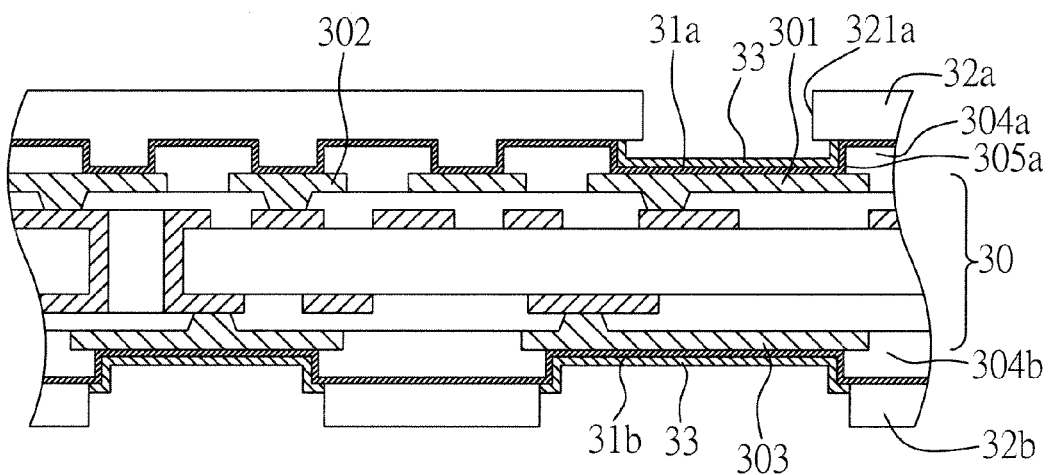

Additionally, referring to FIG. 4E, first electrically connecting structure 33 are formed by electroplating on the first and second conductive layers 31a, 31b of the first and third electrically connecting pads 310, 303 in the openings 321a, 321b, using the first and second conductive layers 31a, 31b as current-conducting paths. Moreover, the electrically connecting structure 33 is conductive solder material and formed by electroplating.

Furthermore, the openings 321a in the first resist layer corresponding to the first electrically pads 301 are larger than the openings 305a in the first insulating protective layer. Accordingly, the first electrically connecting structures 33 are formed on the conductive layer 31a such that the first electrically connecting structure 33 forms a lip around the edge of each of the openings 305a coated with the conductive layer 31a of the first insulating protective layer.

Then, referring to FIG. 4E', the openings 321a in the first resist layer corresponding to the first electrically pads 301 are smaller than the opening 305a in the first insulating protective layer. Accordingly, the first electrically connecting structures 33 are only formed in the interior of the openings 305a of the first insulating protective layer.

Figure 4F:
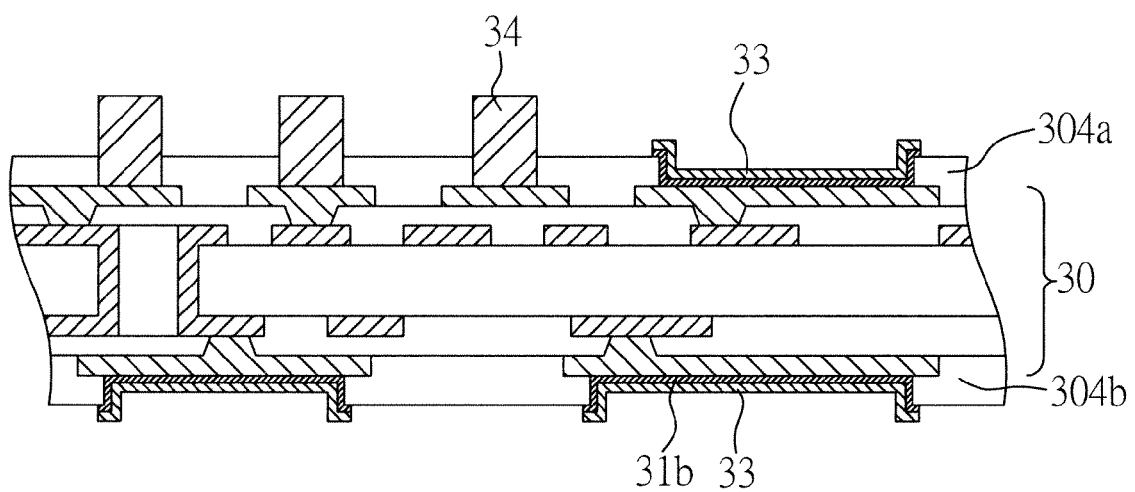

Finally, referring to FIG. 4F, the first and second resist layers 32a, 32b and the first and second conductive layers 31a, 31b covered by the first and second resist layers are removed by physical or chemical stripping. Additionally, the first conductive layer 31a on the surface of the second electrically connecting pads 302 in the openings (unlabeled) of the first insulating protective layer 304a is removed. Accordingly, the first electrically connecting structures 33 are exposed from its location at the surface on the conductive layers 31a, 31b on the first and third electrically connecting pads 301, 303, and, at this point, the second electrically connecting pad 302 is fully exposed. Then, a second electrically connecting structures 34 are formed by stencil printing on the surface of the second electrically connecting pads 302 in the openings 305a of the first insulating protective layer 304a.

The Third Embodiment

Referring to FIGS. 5A to 5D, yet another fabricating method for the present invention is depicted. The difference from the foregoing embodiment is that the first and second resist layers are formed on the first and second conductive layers by laminating. The detailed descriptions are as followings.

Figure 5A:
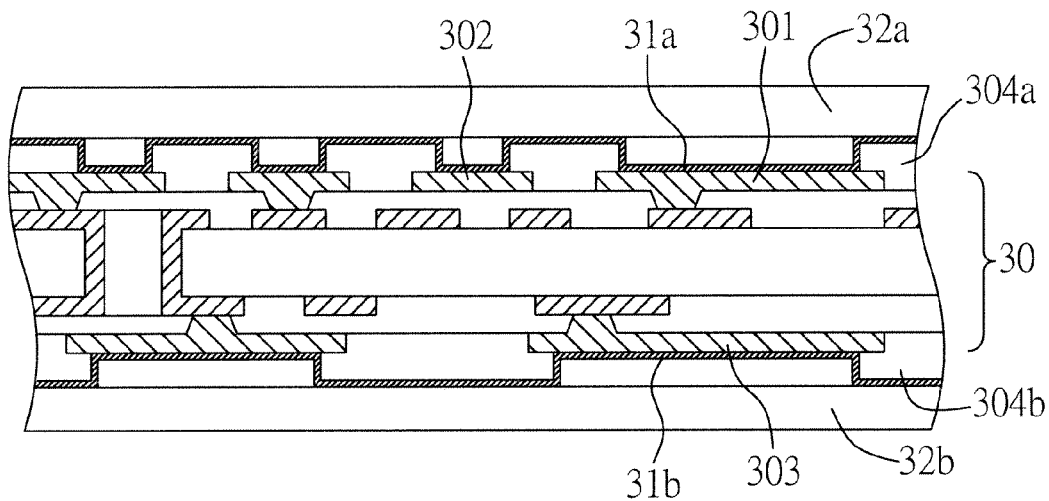
FIGS. 5A to 5D are cross-sectional views showing the third embodiment of a method for fabricating a circuit board with a conductive structure of the present invention.

Firstly, referring to FIG. 5A, first and second conductive layers 31a, 31b are formed on the surface of the first and second insulating protective layers 304a, 304b and in the openings 305a, 305b of the first and second insulating protective layers 304a, 304b on the circuit board 30. The first and second conductive layers 31a, 31b are electrically connected to the first, second, and third electrically connecting pads 301, 302, 303. Then, first and second resist layers 32a, 32b are formed on the first and second conductive layers 31a, 31b by laminating.

Figure 5B:
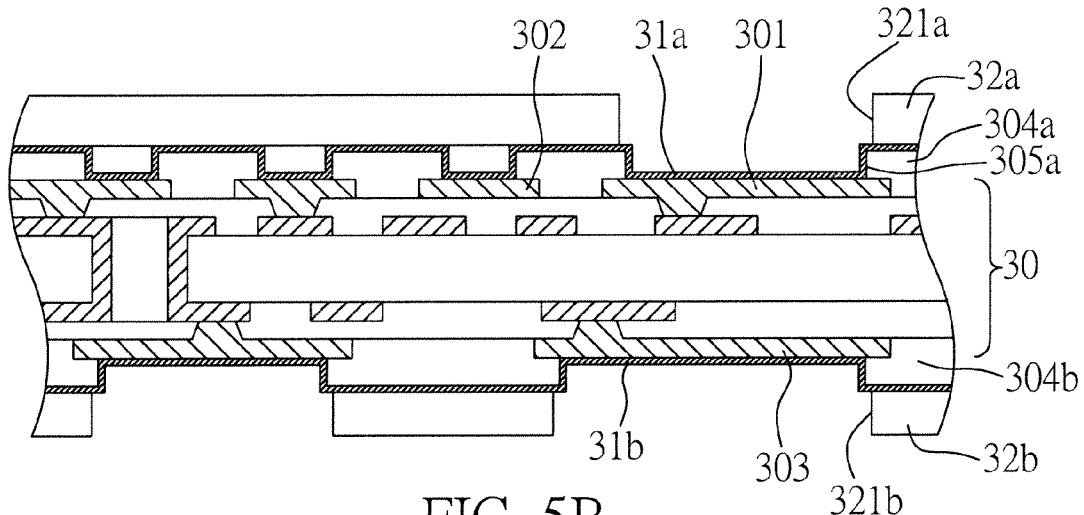

Secondly, referring to FIG. 5B, a plurality of openings 321a, 321b corresponding to the first and third electrically connecting pads 301, 303 are formed by exposure and developing processes on the first and second resist layers 32a, 32b. Therefore, the first and second conductive layers 31a, 31b on the surfaces of the first and third electrically connecting pads 301, 303 are exposed.

Figure 5C:
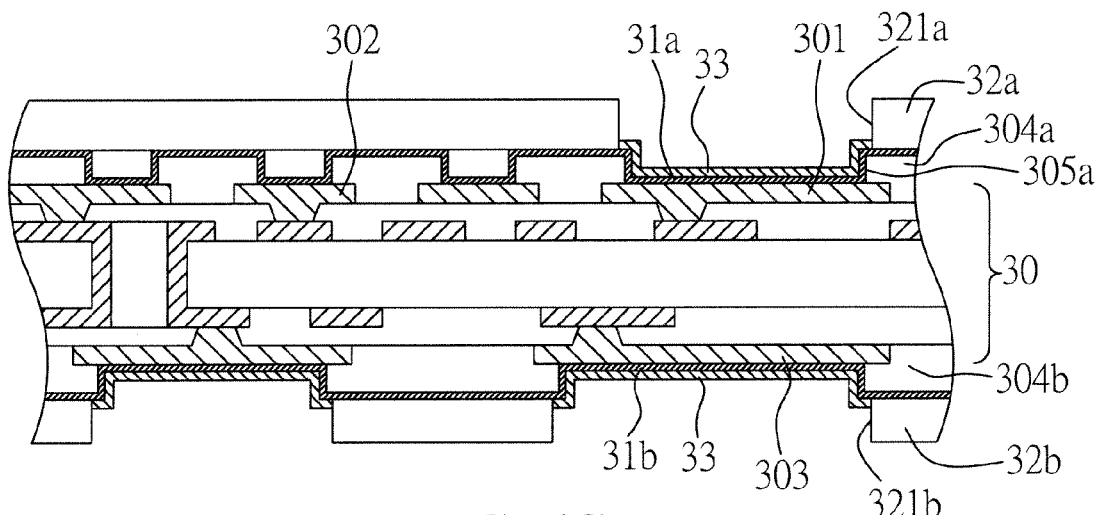
Figure 5C:
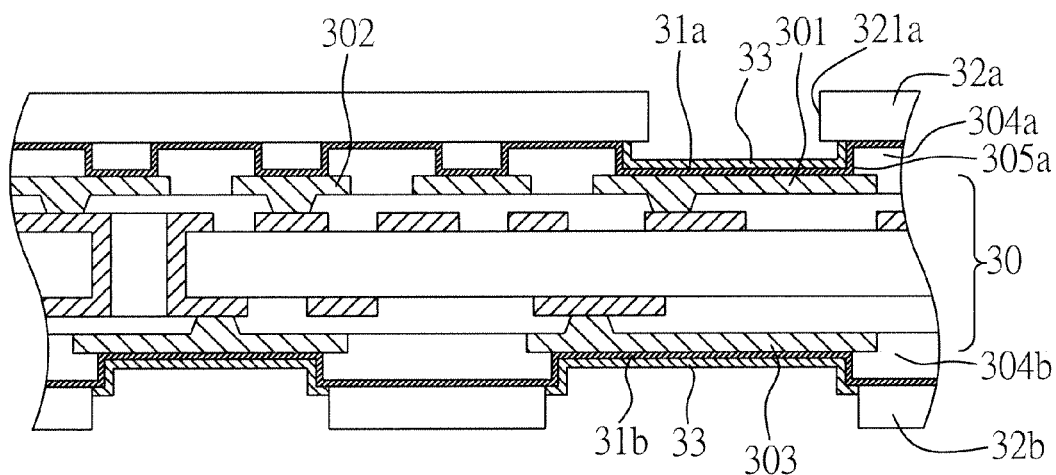

Thirdly, referring to FIG. 5C, a first electrically connecting structures 33 are formed by electroplating on the first and second conductive layers 31a, 31b of the first and third electrically connecting pads 310, 303 in the openings 321a, 321b, using the first and second conductive layers 31a, 31b as current-conducting paths.

Moreover, the openings 321a in the first resist layer corresponding to the first electrically pads 301 are larger than the openings 305a in the first insulating protective layer. Accordingly, the first electrically connecting structures 33 are formed on the conductive layer 31a such that the first electrically connecting structure 33 forms a lip around the edge of each of the openings 305a coated with the conductive layer 31a of the first insulating protective layer.

In addition, referring to FIG. 5C', the opening 321a in the first resist layer corresponding to the first electrically pads 301 is smaller than the opening 305a in the first insulating protective layer. Accordingly, the first electrically connecting structures 33 are only formed in the interior of the openings 305a of the first insulating protective layer. This is another embodiment of the openings 321a.

Figure 5D:
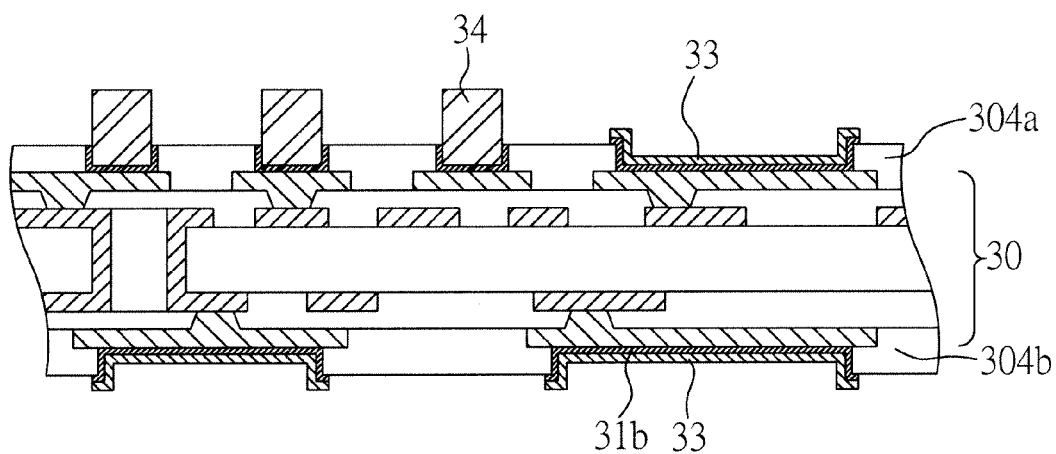

Finally, referring to FIG. 5D, the first and second resist layers 32a, 32b and the first and second conductive layers 31a, 31b covered by the first and second resist layers are removed by physical or chemical stripping. Accordingly, the first electrically connecting structures 33 are exposed on the surface of the first and third electrically connecting pads 301, 303, and the second electrically connecting pad 302 is fully exposed. Then, a second electrically connecting structures 34 are formed by stencil printing on the first conductive layer 31a of the surface of the second electrically connecting pads 302 in the opening of the first insulating protective layer 304a.

The Fourth Embodiment

Referring to FIGS. 6A to 6F, a final fabricating method for the present invention is depicted. The difference from the foregoing embodiment is that first and second electrically connecting structures are formed respectively on the surfaces and in the openings of the first and second insulating protective layer. Then, the second electrically connecting structures are formed by the stencil printing on the first electrically connecting structure of the second electrically connecting pad. The detailed descriptions are as followings.

Figure 6A:
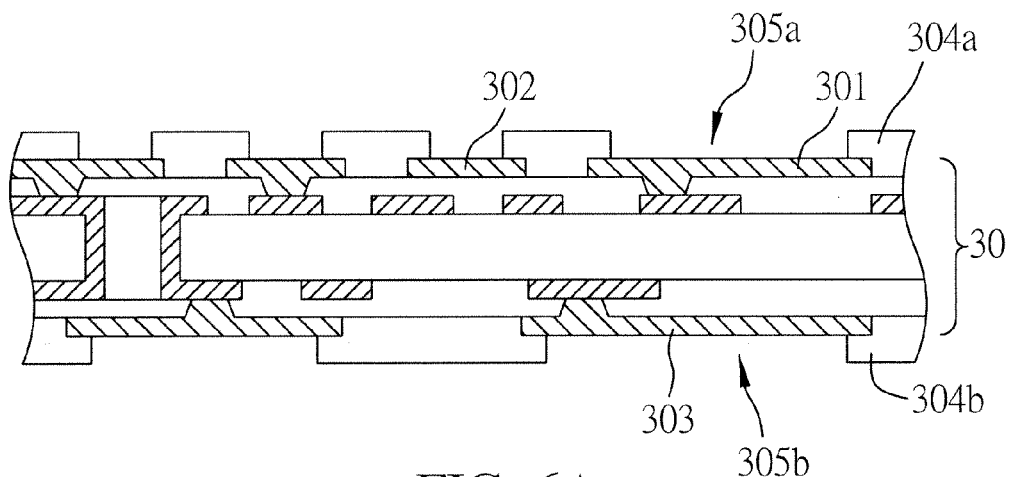
FIGS. 6A to 6F are cross-sectional views showing the forth embodiment of a method for fabricating a circuit board with a conductive structure of the present invention.

Firstly, referring to FIG. 6A, a circuit board 30 is provided with first and a second surfaces (as in elements 30a and 30b of FIG. 4A), and the first surface has a plurality of first electrically connecting pads 301 and a second electrically connecting pads 302, while the second surface 30b has a plurality of third electrically connecting pads 303. Additionally, first and second insulating protective layers 304a, 304b are formed on the first and second surfaces of the circuit board 30, and a plurality of openings 305a, 305b are formed to expose the first, second, and third electrically connecting pads 301, 302, 303.

Figure 6B:
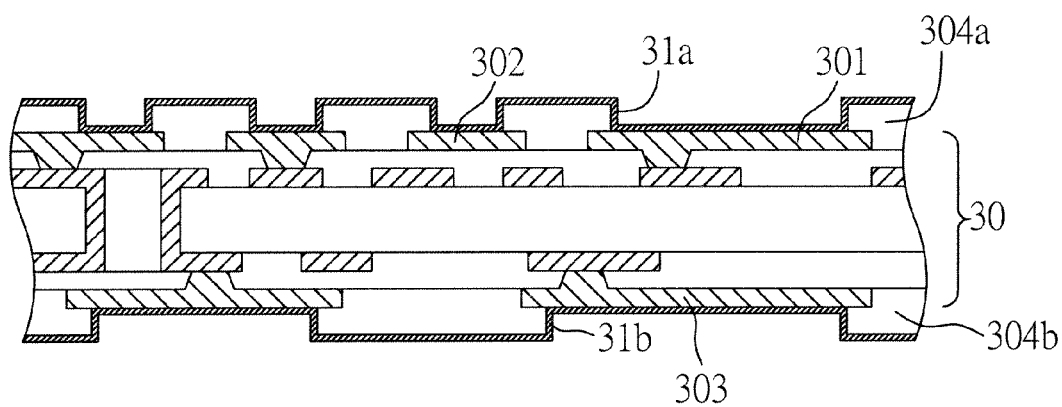

Secondly, referring to FIG. 6B, first and second conductive layers 31a, 31b are formed on the surface of the first and second insulating protective layers 304a, 304b and in the openings 305a, 305b of the first and second insulating protective layers 304a, 304b. The first and second conductive layers 31a, 31b are electrically connected to the first, second, and third electrically connecting pads 301, 302, 303.

Figure 6C:
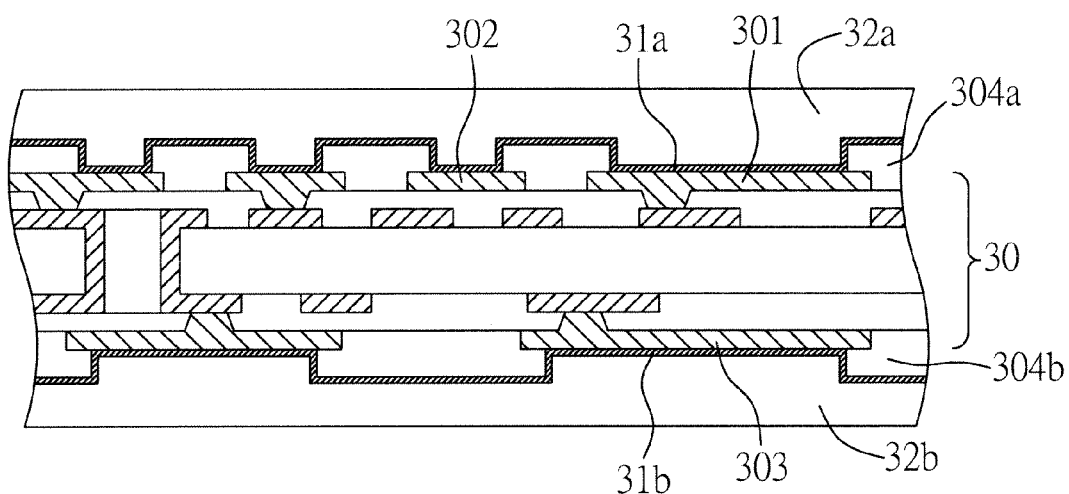
Figure 6D:
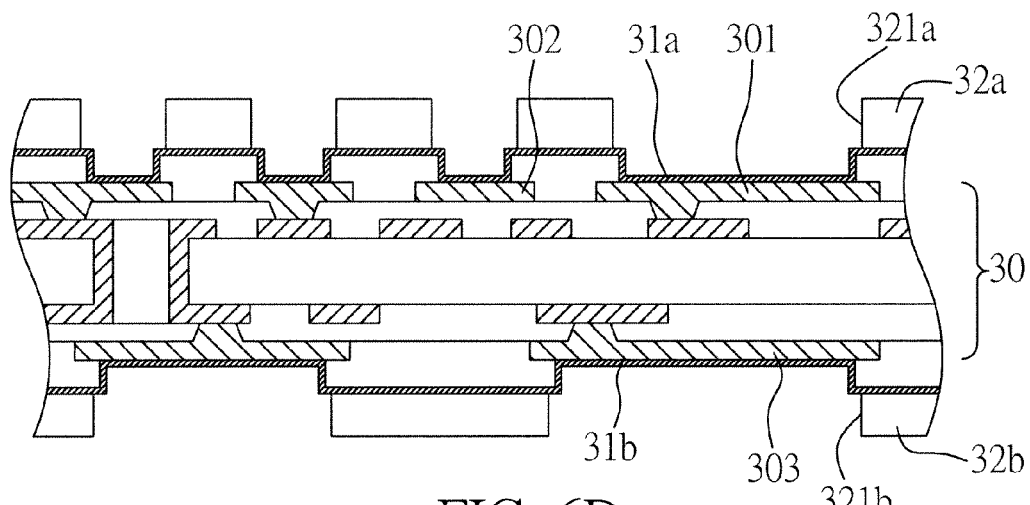

Then, referring to FIGS. 6C and 6D, first and second resist layer 32a, 32b are formed by laminating or coating on the first and second conductive layers 31a, 31b. In addition, a plurality of openings 321a, 321b corresponding to the first, second, and third electrically connecting pads 301, 302, 303 are formed by exposure and developing of the first and second resist layers 32a, 32b. Therefore, the first and second conductive layers 31a, 31b on the surfaces of the first, second and third electrically connecting pads 301, 302, 303 are exposed.

Figure 6E:
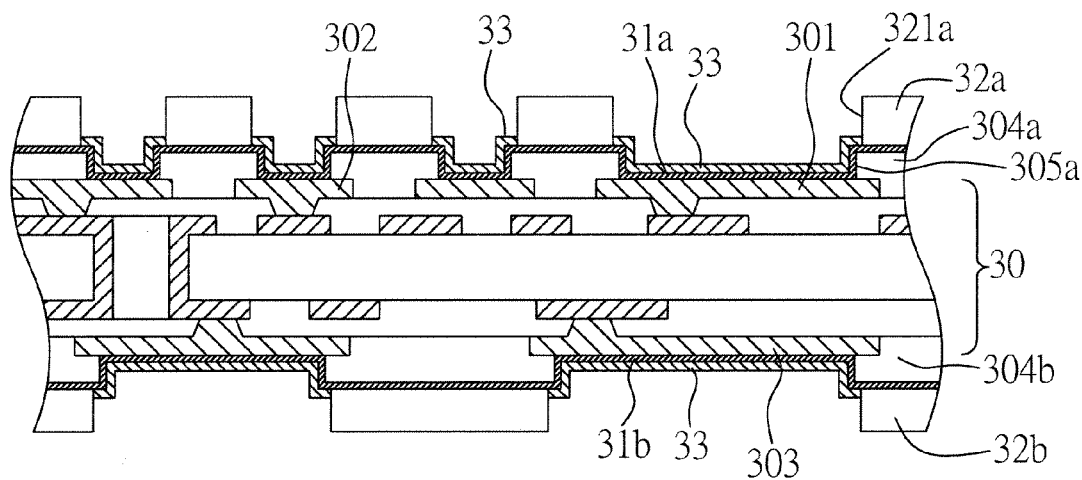
Figure 6E:
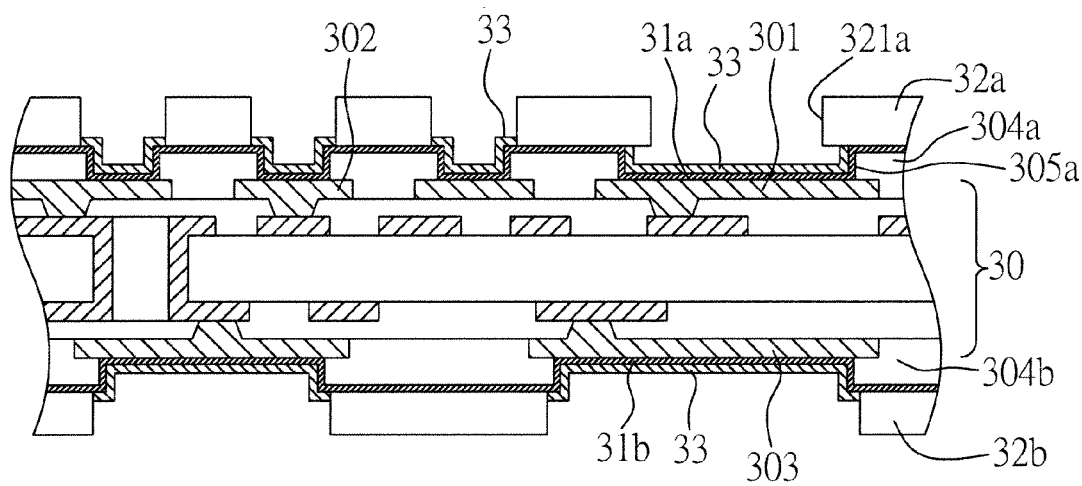

Additionally, referring to FIG. 6E, a first electrically connecting structures 33 are formed by electroplating on the first and second conductive layers 31a, 31b of the first, second, and third electrically connecting pads 301, 302, 303 in the openings 321a, 321b, using the first and second conductive layers 31a, 31b as current-conducting paths.

Furthermore, the openings 321a in the first resist layer corresponding to the first electrically pads 301 are larger than the opening 305a in the first insulating protective layer. Accordingly, the first electrically connecting structures 33 are formed on the conductive layer 31a such that the first electrically connecting structure 33 forms a lip around the edge of each of the openings 305a coated with the conductive layer 31a of the first insulating protective layer.

Then, referring to FIG. 6E', the opening 321a in the first resist layer corresponding to the first electrically pads 301 are smaller than the opening 305a in the first insulating protective layer. Accordingly, the first electrically connecting structures 33 are only formed in the interior of the openings 305a of the first insulating protective layer.

Figure 6F:
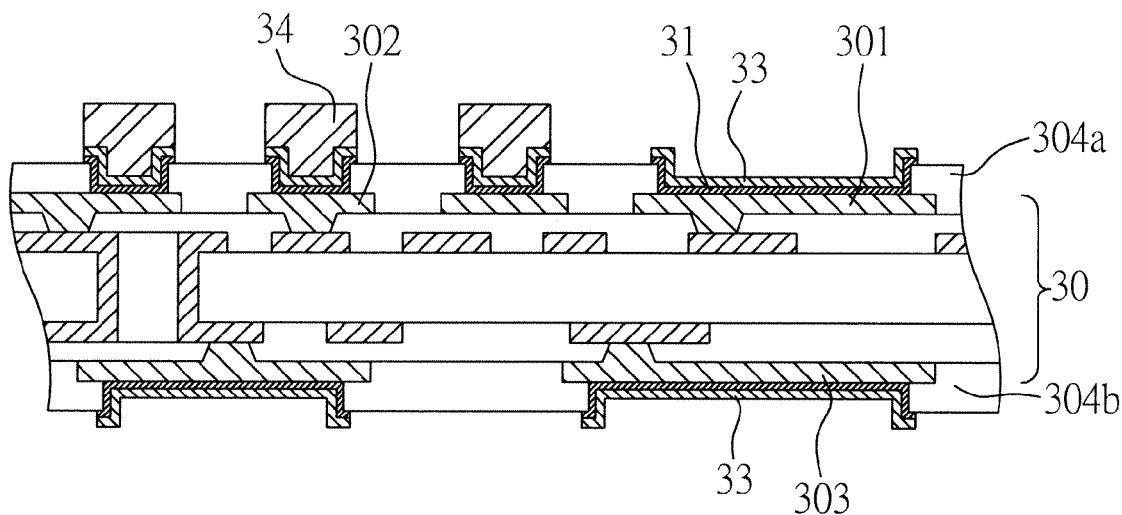

Finally, referring to FIG. 6F, the first and second resist layers 32a, 32b and the first and second conductive layers 31a, 31b covered by the first and second resist layers are removed by physical or chemical stripping. Accordingly, the first electrically connecting structures 33 are exposed on the surface of the first, second, and third electrically connecting pads 301, 302, 303. Then, a second electrically connecting structures 34 are formed by stencil printing on the surface of the first electrically connecting structures 33 on the conductive layer 31a on the second electrically connecting pads 302 in the opening 305a of the first insulating protective layer 304a.

In summary, the present invention proposes a method for fabricating a circuit board with a conductive structure, such that the first and second electrically connecting structures are formed by electroplating or stencil printing processes and by different materials on the first, second, and third electrically connecting pads. In addition, the first electrically connecting structure consists of electrically connecting solder material, and is formed by electroplating, while the second electrically connecting structure consists of pre-solder bumps selected from a group of tin, silver, gold, bismuth, lead, zinc, copper or other compound metals formed by stencil printing. Therefore, electrical connections for surface mount technology with low connectivity or electrical connections for reflow soldering with high connectivity are formed on the electrically connecting pads, meeting the requirement of providing electrical connections with differing properties.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a circuit board with a conductive structure, comprising the steps of:
   providing a circuit board with first and second surfaces, the first surface of the circuit board having a plurality of first and second electrically connecting pads, and the second surface having a plurality of third electrically connecting pads, and, moreover, forming first and second insulating protective layers respectively on the first and second surfaces, and forming a plurality of openings to expose the first, second, and third electrically connecting pads;
   forming a conductive layer on the surfaces of the first insulating protective layer and the openings, electrically connected to the first and second electrically connecting pads on the first surface of the circuit board;
   forming first and second resist layers on the surfaces of the conductive layer and the second insulating protective layer respectively, and forming a plurality of openings in the first resist layer to expose the conductive layer on the first and second electrically connecting pads on the first surface;
   forming first electrically connecting structures by electroplating on the exposed conductive layer over the first and second electrically connecting pads in the openings of the first resist layer;
   removing the first and the second resist layers and the conductive layer covered by the first resist layer; and
   forming second electrically connecting structures by stencil printing on the conductive layer over the second electrically connecting pads on the first surface of the circuit board and on the third electrically connecting pads of the second surface of the circuit board.

2. The method for fabricating a circuit board with a conductive structure of claim 1, wherein the first electrically connecting structure is formed by electroplating, and the conductive layer is used for current conduction.

3. The method for fabricating a circuit board with a conductive structure of claim 1, wherein the first electrically connecting structure is solder material.

4. The method for fabricating a circuit board with a conductive structure of claim 1, wherein the second electrically connecting structure is composed of pre-solder bumps.

5. The method for fabricating a circuit board with a conductive structure of claim 1, wherein the second electrically connecting structure is selected from a group of tin, silver, gold, bismuth, lead, zinc, copper or other compound metals.

6. The method for fabricating a circuit board with a conductive structure of claim 1, wherein the openings in the first resist layer corresponding to the first electrically pads are larger than the openings in the first insulating protective layer, so as to expose the surfaces of the first electrically connecting pads and the conductive layer around the openings in the first insulating protective layer.

7. The method for fabricating a circuit board with a conductive structure of claim 1, wherein the openings in the first resist layer corresponding to the first electrically pads are smaller than the openings in the first insulating protective layer, so as to expose the conductive layer on the surface of the first electrically connecting pads.

8. A method for fabricating a circuit board with a conductive structure, comprising the steps of:
   providing a circuit board with first and second surfaces, the first surface of the circuit board having a plurality of first and second electrically connecting pads, and the second surface having a plurality of third electrically connecting pads, and, moreover, forming first and second insulating protective layers respectively on the first and second surfaces, and forming a plurality of openings to expose the first, second, and third electrically connecting pads;
   forming a first conductive layer on the surfaces of the first insulating protective layer and the openings, electrically connected to the first and second electrically connecting pads on the first surface of the circuit board;
   forming a second conductive layer on the surfaces of the second insulating protective layer and the openings, electrically connected to the third electrically connecting pads of the circuit board;
   forming first and second resist layers on the surfaces of the first and second conductive layers respectively, and forming a plurality of openings in the first and second resist layers to expose the first and second conductive layers on the first and third electrically connecting pads;
   forming first electrically connecting structures by electroplating on the first and second conductive layers on the first and third electrically connecting pads;
   removing the first and second resist layers, and removing the first and second conductive layers covered by the first and second resist layers; and
   forming second electrically connecting structures by stencil printing on the surfaces of the second electrically connecting pads in the openings of the first insulating layer.

9. The method for fabricating a circuit board with a conductive structure of claim 8, wherein a first conductive layer is between the second electrically connecting pad and the second electrically connecting structure.

10. The method for fabricating a circuit board with a conductive structure of claim 8, wherein the first electrically connecting structure is formed by electroplating, and the conductive layer is used for current conduction.

11. The method for fabricating a circuit board with a conductive structure of claim 8, wherein the first electrically connecting structure is solder material.

12. The method for fabricating a circuit board with a conductive structure of claim 8, wherein the second electrically connecting structure is composed of pre-solder bumps.

13. The method for fabricating a circuit board with a conductive structure of claim 8, wherein the second electrically connecting structure is selected from a group of tin, silver, gold, bismuth, lead, zinc, copper or other compound metals.

14. The method for fabricating a circuit board with a conductive structure of claim 8, wherein the openings in the first resist layer corresponding to the first electrically pads are larger than the openings in the first insulating protective layer, so as to expose the surfaces of the first electrically connecting pads and the conductive layer around the openings in the first insulating protective layer.

15. The method for fabricating a circuit board with a conductive structure of claim 8, wherein the openings in the first resist layer corresponding to the first electrically pads are smaller than the openings in the first insulating protective layer, so as to expose the conductive layer on the surface of the first electrically connecting pads.

16. A method for fabricating a circuit board with a conductive structure, comprising the steps of:
   providing a circuit board with first and second surfaces, the first surface of the circuit board having a plurality of first and second electrically connecting pads, and the second surface having a plurality of third electrically connecting pads, and, moreover, forming first and second insulating protective layers respectively on the first and second surfaces, and forming a plurality of openings to expose the first, second, and third electrically connecting pads;
   forming a first conductive layer on the surfaces of the first insulating protective layer and the openings, electrically connected to the first and second electrically connecting pads on the first surfaces of the circuit board;
   forming a second conductive layer on the surfaces of the second insulating protective layer and the openings, electrically connected to the third electrically connecting pads on the circuit board;
   forming first and second resist layers on the surfaces of the first and second conductive layers respectively, and forming a plurality of openings in the first and second resist layers to expose the first and second conductive layers on the first, second, and third electrically connecting pads;
   forming first electrically connecting structures by electroplating on the first and second conductive layers on the first, second, and third electrically connecting pads in the openings of the first and second resist layers;
   removing the first and second resist layers, and removing the first and second conductive layers covered by the first and second resist layers; and
   forming second electrically connecting structures by stencil printing on the first electrically connecting structures of the first conductive layer on surfaces of the second electrically connecting pads in the openings of the first insulating layer.

17. The method for fabricating a circuit board with a conductive structure of claim 16, wherein the first electrically connecting structure is formed by electroplating, and the first and second conductive layers are used for current conduction.

18. The method for fabricating a circuit board with a conductive structure of claim 16, wherein the first electrically connecting structure is solder material.

19. The method for fabricating a circuit board with a conductive structure of claim 16, wherein the second electrically connecting structure is composed of pre-solder bumps.

20. The method for fabricating a circuit board with a conductive structure of claim 16, wherein the second electrically connecting structure is selected from a group of tin, silver, gold, bismuth, lead, zinc, copper or other compound metals.

21. The method for fabricating a circuit board with a conductive structure of claim 16, wherein the openings in the first resist layer corresponding to the first electrically pads are larger than the openings in the first insulating protective layer, so as to expose the surfaces of the first electrically connecting pads and the conductive layer around the openings in the first insulating protective layer.

22. The method for fabricating a circuit board with a conductive structure of claim 16, wherein the openings in the first resist layer corresponding to the first electrically pads are smaller than the openings in the first insulating protective layer, so as to expose the conductive layer on the surface of the first electrically connecting pads.

* * * * *